(12) United States Patent
Kitson et al.

(10) Patent No.: US 11,745,532 B2
(45) Date of Patent: Sep. 5, 2023

(54) SOLVENT-FREE FLEXOGRAPHIC IMAGING AND PRINTING WITH PHOTORESPONSIVE PRINTING MEMBERS

(71) Applicants: Anthony P. Kitson, West Suffield, CT (US); Kevin Ray, Windham, NH (US)

(72) Inventors: Anthony P. Kitson, West Suffield, CT (US); Kevin Ray, Windham, NH (US)

(73) Assignee: Verico Technology LLC, Enfield, CT (US)

( * ) Notice: Subject to any disclaimer, the term of this patent is extended or adjusted under 35 U.S.C. 154(b) by 0 days.

(21) Appl. No.: 17/894,278

(22) Filed: Aug. 24, 2022

(65) Prior Publication Data

US 2023/0037817 A1 Feb. 9, 2023

Related U.S. Application Data

(63) Continuation of application No. 16/672,684, filed on Nov. 4, 2019, now abandoned.

(51) Int. Cl.
*B41N 1/12* (2006.01)
*G03F 7/20* (2006.01)
*B41C 1/05* (2006.01)

(52) U.S. Cl.
CPC ............... *B41N 1/12* (2013.01); *B41C 1/05* (2013.01); *G03F 7/202* (2013.01); *B41C 2210/26* (2013.01); *B41N 2207/14* (2013.01)

(58) Field of Classification Search
None
See application file for complete search history.

(56) References Cited

U.S. PATENT DOCUMENTS

| 5,344,744 | A  | 9/1994 | Ueda et al. |
| 6,194,125 | B1 | 2/2001 | Goffing et al. |
| 6,444,378 | B1 | 9/2002 | Johnson |
| 2009/0075199 | A1 | 3/2009 | Lungu |
| 2017/0021656 | A1 | 1/2017 | Ray et al. |
| 2021/0129573 | A1 | 5/2021 | Kitson et al. |

FOREIGN PATENT DOCUMENTS

JP 6030901 B2 11/2016

OTHER PUBLICATIONS

Extended European Search Report for European Application No. 20201725.7 dated Apr. 9, 2021 (8 pages).

*Primary Examiner* — Joshua D Zimmerman
(74) *Attorney, Agent, or Firm* — Morgan, Lewis & Bockius LLP

(57) ABSTRACT

Flexographic printing members amenable to aqueous (or organic) development do not exhibit the deleterious effects on printing performance characteristic of some conventional alternatives. Embodiments of the invention utilize a photopolymerizable layer comprising, consisting of, or consisting essentially of a photopolymerization initiator and a water-dilutable (but not water-soluble) monomer.

15 Claims, 2 Drawing Sheets

SOLVENT-FREE FLEXOGRAPHIC IMAGING AND PRINTING WITH PHOTORESPONSIVE PRINTING MEMBERS

RELATED APPLICATIONS

This application is a continuation of U.S. patent application Ser. No. 16/672,684, filed Nov. 4, 2019, the entire disclosure of which is hereby incorporated herein by reference.

BACKGROUND OF THE INVENTION

Flexography utilizes resilient relief members to transfer an image from a printing member to a recording medium. As in letterpress printing, a flexographic member or plate has a surface comprising an "imagewise" pattern of raised features. Ink is applied to and carried by these raised features and transferred therefrom to the image receiver. Although developed primarily for printing packaging materials, flexography is today used in a wide variety of applications and on recording media such as paper, corrugated board, films, foils, and laminates.

Flexographic printing plates can be prepared from photosensitive elements comprising a photopolymerizable layer containing an elastomeric binder, a monomer, and a photoinitiator, interposed between a support and a cover sheet or multilayer cover element. A standard process of making such photosensitive elements is described in U.S. Pat. No. 4,460,675; as set forth therein, a previously extruded photopolymerizable composition is fed into the nip of a calender (i.e., a series of hard, high-pressure rollers in rolling contact) and is pressed between a support and a multilayer cover element to form a photopolymerizable layer. Upon imagewise exposure of the photosensitive element to actinic radiation through a photomask, the exposed areas of the photopolymerizable layer become insolubilized. Treatment with a suitable solvent or solvent mixture removes the unexposed areas of the photopolymerizable layer, leaving a printing relief which can be used for flexographic printing. See also U.S. Pat. Nos. 4,323,637, 4,427,759, and 4,894,315.

The photomask may be ablatable by, for example, infrared (IR) radiation but is opaque to actinic (e.g., ultraviolet (UV)) radiation. This IR-sensitive layer may be imaged digitally, using a laser. Subsequent overall exposure of the photopolymerizable element to actinic radiation through the imagewise-ablated photomask produces an imagewise pattern of hardened regions; unpolymerized areas that did not receive exposure, and remaining areas of the IR-sensitive layer, are washed away during development. Following drying, the flexographic printing plate is ready for use.

Developing the exposed photosensitive element with a solvent or solvent mixture is time-consuming, since drying for extended period (0.5 to 24 hours) is typically necessary to remove entrained developer solution. In addition, these developing systems produce potentially toxic by-product wastes (both the solvent and any material carried off by the solvent). For printing of food packaging, elimination of solvent residue on the finished plate is also crucial. Accordingly, many flexographic plates use water-soluble photopolymerizable layers to permit aqueous development. While convenient, such plates can exhibit poor chemical resistance and other vulnerabilities to image integrity.

SUMMARY OF THE INVENTION

The present invention is directed toward achieving the benefits of aqueous development without the accompanying deleterious effects on printing performance. Embodiments of the invention utilize a photopolymerizable layer comprising, consisting of, or consisting essentially of a photopolymerization initiator and a water-dilutable (but not water-soluble) monomer. Optionally, the photopolymerizable layer may include a water-hydrolyzable binder. Other optional ingredients that may be present are binders such as natural and synthetic rubbers, monomers and oligomers, dyes, and/or anti-oxidants. None of these optional materials contributes to function or structure, so a formulation consisting essentially of a photopolymerization initiator and a water-dilutable (but not water-soluble) monomer may include any or all of these optional materials.

Advantages offered by embodiments of the invention include environmentally friendly development (without organic solvents), fast development times, good image integrity with high resolution, good ink receptivity, and good chemical resistance. Surprisingly, even when emulsified, the photopolymer composition can be developed using organic developers despite the presence of a monomer selected to permit aqueous processing. The approach described herein may be applied not only to flexographic printing plates but also to lithographic printing plates, letterpress plates, and raised-feature photopolymer signs such as Braille signs.

Accordingly, in a first aspect, the invention relates to a method of preparing a printing member. In various embodiments, the method comprises the steps of providing a printing member comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of photopolymer polymerizable by actinic radiation, the photopolymer consisting essentially of an initiator and a water-dilutable but not water-soluble monomer; exposing the precursor to actinic radiation through the photomask to cause polymerization of the photopolymer; and developing the printing member with an aqueous medium or an organic solvent to remove only unexposed portions of the photopolymer layer.

The photopolymer may be capable of emulsification in water. For example, the water-dilutable but not water-soluble monomer may be an aliphatic urethane acrylic oligomer. In some embodiments, the photopolymer layer also includes a hydrolyzable binder, e.g., a natural or synthetic rubber. For example, the rubber may be butadiene maleic anhydride copolymer. In various embodiments, the photopolymer layer further comprises a dye and/or an anti-oxidant. The printing member may be a flexographic printing member or a letterpress printing member.

In another aspect, the invention pertains to a printing member comprising, in various embodiments, a laser-ablatable layer comprising a material that absorbs laser radiation; a support; and disposed between the laser-ablatable layer and the support and in contact with opposed surfaces thereof, a layer of photopolymer polymerizable by actinic radiation. The photopolymer comprises an initiator and a water-dilutable but not water-soluble monomer, and the photopolymer is developable by organic and aqueous solvents and combinations thereof.

The laser-ablatable layer may be ablatable by IR radiation, and may consist essentially of a polymer and carbon black dispersed therein. In various embodiments, the photopolymer layer also includes a hydrolyzable binder, e.g., a rubber such as butadiene maleic anhydride copolymer or polyisoprene maleic anhydride rubber. For example, a butadiene maleic anhydride copolymer may be a butadiene/styrene/maleic anhydride copolymer.

In various embodiments, the photopolymer layer further comprises a dye and/or an anti-oxidant. The printing member may be a flexographic printing member or a letterpress printing member.

As used herein, the term "free radical" refers to a highly reactive atom or molecule with at least one unpaired electron. A "free-radical polymerization mechanism" means initiation of polymerization by free radicals that attack short-chain oligomers with ethylenic unsaturation; these free radical species are known as "free-radical initiators."

"Water-dilutable" has the same meaning as "water-reducible," referring to a material that may be diluted with water—i.e., its concentration may be reduced uniformly by addition of water. A material that is water-dilutable without being water-soluble means that the material disperses uniformly in water but remains as a separate phase (that may, for example, be filtered) with a particle size of at least 1 nm and in some cases at least 1 µm, with water as the continuous phase. For example, a material capable of emulsification is water-dilutable but not water-soluble. A material that is infinitely water-dilutable disperses uniformly in water regardless of the volume of water relative to that of the infinitely water-dilutable material.

The term "monomer" refers generally to a functional chemical unit that may be covalently linked with other such units to form a polymer. However, the term is used broadly to include oligomers, which include one or more repeating units but can themselves be linked to form a polymer.

The term "plate" or "member" refers to any type of printing member or surface capable of recording an image defined by regions exhibiting differential affinities for ink and/or fountain solution. Suitable configurations include the traditional planar or curved plates that are mounted on the plate cylinder of a printing press, but can also include seamless cylinders (e.g., the roll surface of a plate cylinder), an endless belt, or other arrangement.

The term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

The term "substantially" or "approximately" means ±10% (e.g., by weight or by volume), and in some embodiments, ±5%. The term "consists essentially of" means excluding other materials that contribute to function or structure. For example, a radiation-sensitive composition consisting essentially of a polymerizable component, an initiator composition, a radiation-absorbing component and a polymeric binder may include other ingredients, such as a catalyst, that may perform important functions but do not constitute part of the polymer structure of the composition following polymerization. Percentages refer to weight percentages unless otherwise indicated.

DESCRIPTION OF DRAWINGS

The foregoing discussion will be understood more readily from the following detailed description of the disclosed technology, when taken in conjunction with the following drawings, in which.

DETAILED DESCRIPTION

1. Preparation and Use of Flexographic Plates

Figure 1:
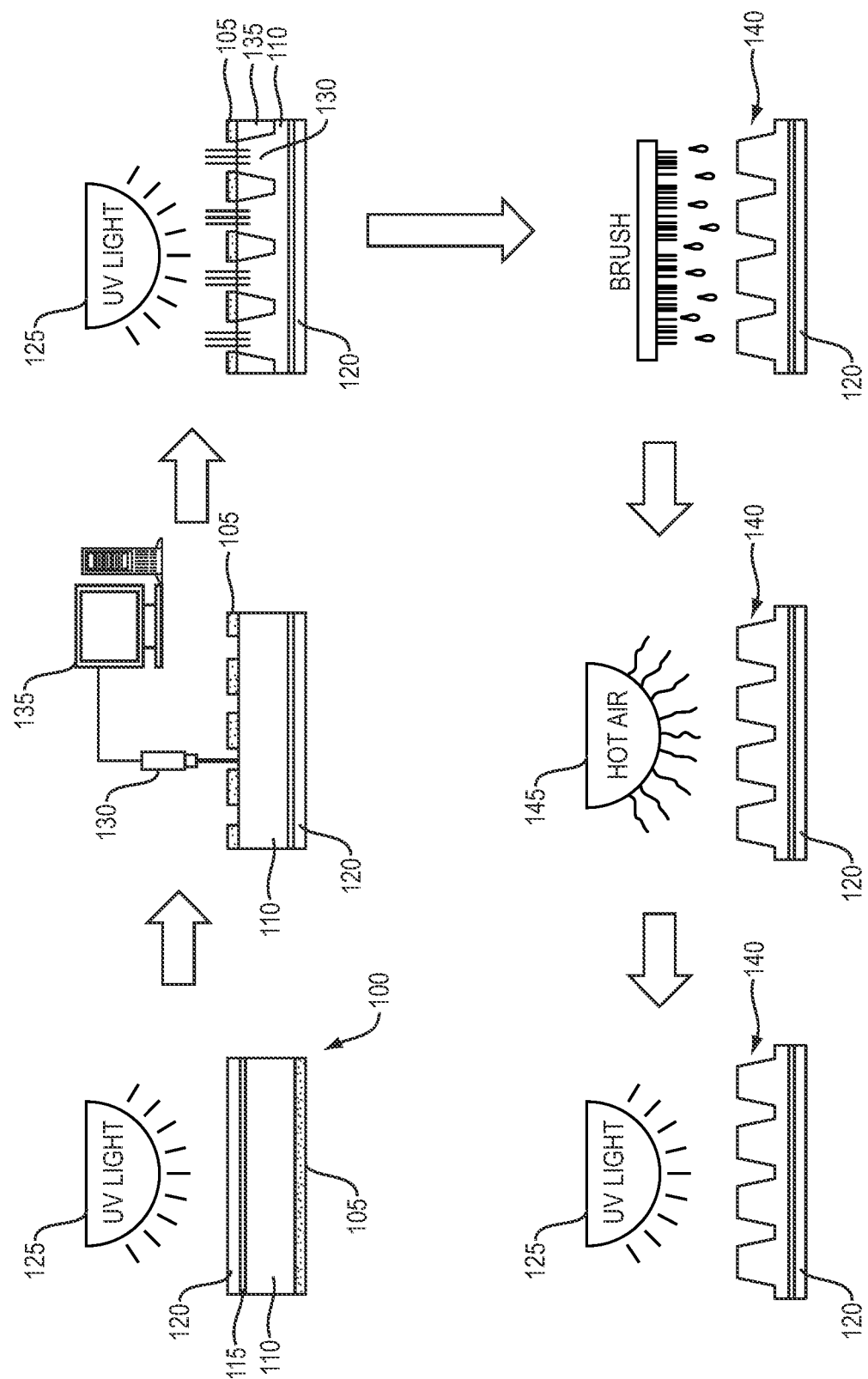
FIG. 1 schematically illustrates preparation of a flexographic printing plate according to embodiments of the invention.

Refer to FIG. 1, which illustrates a representative process for imaging a flexographic printing plate 100. The plate 100 includes a laser-ablation layer 105, a photopolymerizable layer 110, an adhesive and anti-halation layer 115, and a polymer base 120. First, the base 120 of the plate 100 is exposed to actinic radiation from, e.g., a source 125 of UV radiation in order to harden the base 120. The orientation of the plate 100 is then reversed and the ablation layer 105 is selectively removed by a laser 130 emitting, for example, in the near-IR region. The ablation layer contains a material, such as carbon black in an acrylic binder, that absorbs laser radiation and catastrophically overheats, removing the layer 105 where exposed or rendering it easily removed. The output of the laser 130 can be provided directly to the plate surface via lenses or other beam-guiding components, or transmitted to the surface of a blank printing plate from a remotely sited laser using a fiber-optic cable. A controller 135 and associated positioning hardware maintain the beam output at a precise orientation with respect to the plate surface, scan the output over the surface, and activate the laser at positions adjacent selected points or areas of the plate 100. The controller 135 responds to incoming image signals corresponding to the original document or picture being copied onto the plate 100, activing the laser 130 to ablate plate regions that will not receive ink during printing. The image signals are stored as a bitmap data file on a computer. Such files may be generated by a raster image processor ("RIP") or other suitable means.

Following imaging, the ablation layer 105 functions as a mask when the now-reversed plate 100 is again exposed to the source 125 of actinic radiation. Radiation admitted through removed regions of the ablation layer 105 polymerizes the underlying layer 110, hardening it. The effects of the radiation expand with depth in the photopolymerizable layer 110 so that a floor is formed beneath the unexposed regions, thereby creating a series of raised regions 130 and recesses 135. Remaining portions of the imaged ablation layer 105 and unpolymerized regions of layer 110 are then removed by brushing and washing in a "washout" step, leaving a raised pattern of features 140 that will accept and transfer ink during printing. The plate may now be dried, e.g., under a hot-air dryer 145, and subjected again to the source 125 of actinic radiation to complete the photo-curing process.

Different types of UV light may be employed at different points in the process. The first and second exposures may involve a combination (typically the same combination) of UVA or UVB, for example, and the final exposure may be UVC light ("germicidal UV," 100 to 280 nm, usually 280 nm).

Optionally, a very thin additional layer may be included above the photopolymer layer 110 but below the ablative layer 105. This "anti-slip" layer may protect the user and equipment from encountering the photopolymer layer 110, which may be tacky even after the second UV light exposure. This layer, if included, is removed in the washout step. Another optional layer is a plastic coversheet over the ablative layer 105, which provides protection prior to use and its peeled off before or after the ablative layer 105 is imaged.

Figure 2:
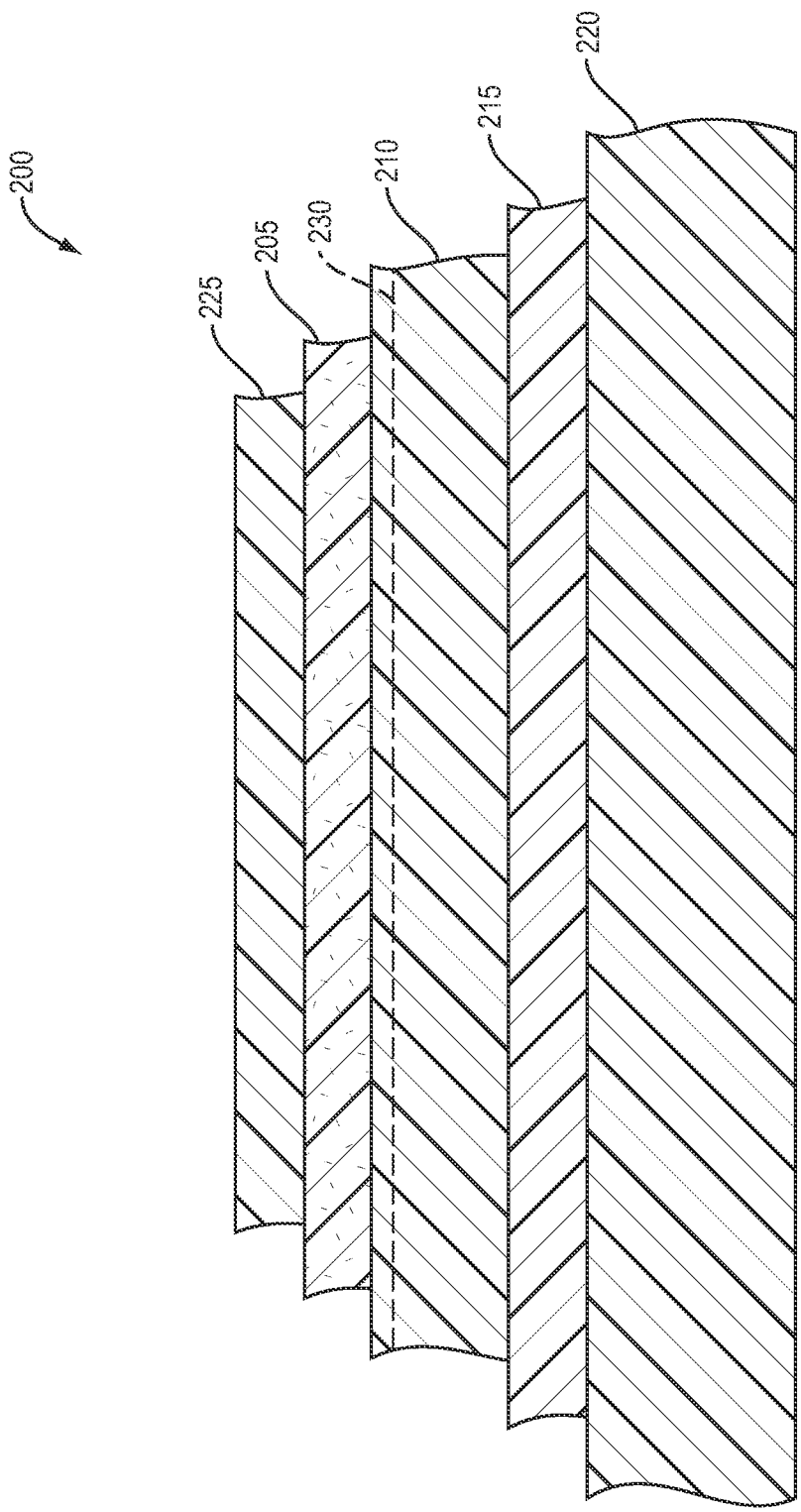
FIG. 2 is a sectional side elevation illustrating the structure of a flexographic printing plate according to embodiments of the invention.

A representative flexographic printing plate 200 in accordance with embodiments of the invention is shown in FIG. 2 and includes a polymer base layer 220, an anti-halation layer 215, a polymeric ablation layer 205 and, sandwiched therebetween, a photosensitive layer 210 comprising a water-dilutable monomer or oligomer. The polymer base layer 220 may be, for example, polyethyelene terephthalate (PET), polycarbonate, polyethylene napthalate, polybutylene terephalate, polyimide, and polyetherketone with a thickness ranging from 0.05 to 0.3 mm. The polymeric ablation layer 205 may be a carbon-loaded acrylic, polyvinyl alcohol or cellulosic resin having a thickness of 0.1 to 5 microns and a loading level of 1 to 75%, and may be coated with an optional anti-slip layer 225. Alternatively, a photomask may be employed.

The photosensitive layer 210, described in greater detail in the examples below, may have a thickness of 0.1 to 10.0 mm. In addition to the water-dilutable (but not water-soluble) monomer, the photosensitive layer may include a hydrolyzable binder such as a natural or synthetic rubber, e.g., butadiene maleic anhydride copolymer or polyisoprene maleic anhydride rubber. In this case, other monomers may be part of the copolymer; for example, the synthetic rubber may be a butadiene/styrene/maleic anhydride copolymer. In some cases, the photopolymer layer 210 can be a stacked series of different layers. The reflection-preventing anti-halation layer 215 may also promote adhesion between the base 220 and the photopolymer layer(s) 210. An anti-slip layer 230 may optionally be included or, in some embodiments, the ablation layer 205 may perform the anti-slip barrier function. In still other embodiments, the ablation layer 205 may be omitted altogether.

The foregoing approach may be applied to lithographic or letterpress plates. A letterpress plate may be structurally similar to a flexographic plate but the support 220 is typically magnetic steel rather than polyester and the exposed photopolymer 210 may be harder than that of a flexographic plate; whereas a typical flexographic plate may have a hardness of about 65-75 Shore A, a letterpress plate may have a hardness of about 65 Shore D.

2. Examples

A series of photopolymer compositions were prepared using the following formulations listed in Table 1 (with all units in grams). Component descriptions and sources appear in Table 2.

TABLE 1

| Composition | Ingredient | | | | | | | | | |
|---|---|---|---|---|---|---|---|---|---|---|
| | 1 | 2 | 3 | 4 | 5 | 6 | 7 | 8 | 9 | 10 |
| 1 | 76.28 | 5.00 | 7.50 | 0.50 | 0.50 | 0.005 | 0.00 | 7.50 | 0.00 | 52.72 |
| 2 | 77.25 | 0.00 | 15.00 | 0.75 | 0.75 | 0.008 | 22.73 | 0.00 | 11.25 | 72.27 |
| 3 | 92.48 | 0.00 | 9.75 | 0.75 | 0.75 | 0.004 | 0.00 | 15.00 | 9.00 | 72.27 |

TABLE 2

| Ingredient No. | Material | Source |
|---|---|---|
| 1 | Tetrahydrofuran | Sigma Aldrich, Milwaukee, WI |
| 2 | Trimethylolpropane ethoxylate tri acrylate | Sigma Aldrich, Milwaukee, WI |
| 3 | SARTOMER CN307 (hydrophobic acrylate ester) | Sartomer, Exton, PA |
| 4 | IRGACURE 651 photoinitiator (2,2-dimethoxy-2-phenyl acetophenone) | Ciba, Newport, DE |
| 5 | Butylated hydroxytoluene | Sigma Aldrich, Milwaukee, WI |
| 6 | ValifastBlue 1605 (spirit color) | Orient Corporation of America, Seaford, DE |
| 7 | NEOREZ 1391 (polyurethane supplied at 35% solids in water) | TCI Materials, Shrewsbury, MA |
| 8 | POLYVEST EPMA120 (polybutadiene resin) | Evonik, Parsippany-Troy Hills, NJ |
| 9 | BOMAR XR9416 (oligomer capable of emulsification in water) | Dymax, Torrington, CT |
| 10 | NIPOL LX11 INF (latex supplied at 55% solids in water) | Zeon Corporation, Tokyo, Japan |

Example C1

Ingredients 1-9 of Composition 1 were dissolved/dispersed in a beaker. Ingredient 10 was then added to the solution slowly while stirring with a Silverson L5 high shear lab mixer. The resulting slurry was poured into a glass dish and placed in an oven for 24 hours at 75° C. to dry.

The resulting composition was compounded into sheet form using a two-roll mill available from Reliable Rubber and Plastic Manufacturing Co, North Bergen, N.J. The roll nip was set to produce a photosensitive sheet with a thickness of approximately 70 mils (0.070 inch). The resulting sheet was laminated to transparent polyester sheets to provide a flexographic printing construction (lacking the ablation mask shown in FIG. 1), with the 70-mil photosensitive layer sandwiched between a PET base layer of 7 mils thickness and a 2-mil PET cover film coated with a release layer.

Imaging was carried out on a Thiemer COPYMAT exposure unit equipped with a THS3007 3000W metal halide UV lamp, available from Thiemer GMBH, Birstein, Germany.

Back exposure: the imageable composition was placed cover sheet down in the light exposure unit and exposed under vacuum for 90 seconds with light intensity set at 50%.

Main exposure: the composition was then placed base sheet down in the exposure unit. A Stouffer graphic-arts test strip was placed on top of the cover sheet, as was a photographic negative imaged with a 65-line screen calibrated screen tint. The photopolymer was then exposed under vacuum for 18 minutes with light intensity set at 50%.

Development: this refers to removal of unexposed (and therefore unpolymerized) photopolymer. The cover sheet was removed, and the patterned photopolymer was placed in a glass dish containing heptane. It was scrubbed with a stiff brush until a relief image formed. The sheet was then dried in an oven at 75° C. for 15 minutes.

Post-exposure: the integrity of the imaged polymer was further enhanced by post-exposure to UV radiation. The sheet was placed base sheet down in the exposure unit and exposed for 6 minutes under vacuum with light intensity set at 50%.

Example C2

Another sheet using Composition 1 ingredients was produced using the same procedures as in Example 1, except the patterned sheet was developed in water containing 5% by weight Stop and Shop brand (54 Hazard Avenue, Enfield, Conn. 06082) dishwasher detergent warmed to 50° C.

Example 3

A sheet using Composition 2 was produced according to the procedures set forth in Example 1.

Example 4

A sheet using Composition 2 was produced according to the procedures set forth in Example 2.

Example 5

A sheet using Composition 3 was produced according to the procedures set forth in Example 1, except the patterned sheet was developed in water containing 2% by weight Stop and Shop brand dishwasher detergent and 2% AJAX Ultra Triple Action liquid dish soap (Colgate-Palmolive, New York City, N.Y. 10022) warmed to 50° C.

Example 6

Another sheet using Composition 3 was produced according to the procedures set forth in Example 1, except the patterned sheet was developed in plain water warmed to 50° C.

Evaluation

The photosensitivity of the sheet was determined by reading the Stouffer test strip. The shore hardness of the imaged photosensitive sheet was measured with a durometer. The ease of development of the composition was graded on a scale of 1 to 5 with 1 corresponding to excellent development (the unexposed material was removed quickly and easily) and 5 representing no development at all. The quality of the image was assessed under magnification and also rated on a scale of 1 to 5 with 1 being full reproduction of the photographic mask and 5 being no image.

Results for Examples 1-6

| Example | Stouffer reading | shore A hardness | ease of development | image quality | Comments |
|---|---|---|---|---|---|
| 1 | solid 8, clear 14 | 70 | 2 | 2 | |
| 2 | — | 70 | 5 | — | Does not develop in detergent |
| 3 | solid 8, clear 15 | 75 | 2 | 2 | |
| 4 | solid 8, clear 16 | 75 | 2 | 3 | develops (rather slowly) in detergent |
| 5 | solid 6, clear 17 | 68 | 1 | 1 | easy to develop and excellent image quality |
| 6 | solid 10, clear 18 | 68 | 2 | 2 | |

Printing with Example 6

In one experiment, a rubber roller was coated in Titan black ink, supplied by Spinks Ink Company, Addison, Ill. The ink was rolled across the surface of the patterned sheet obtained in Example 6. The sheet was placed ink-side-down onto a piece of paper and pressure was applied to reveal a print with good image fidelity.

In another experiment, one part Smooth Lith, available from Van Son, Islandia, N.Y., was added to 9 parts Titan black ink to reduce the tackiness. A Heidelberg GTO printing press was equipped with the ink and the patterned sheet obtained in Example 6 was attached to the plate cylinder using double-sided tape. All packing was removed from the blanket cylinder. The press was run dry (no fountain solution). On the first revolution a good image was transferred from the plate to the blanket. When the blanket was contacted with paper, an image with good fidelity was formed. In this way, multiple copies were made.

Discussion of Results

The formulations of Examples 1 and 2 do not contain a monomer capable of emulsification in water. The composition will develop in organic solvent but will not develop aqueously. Examples 3 and 4 contain a monomer capable of emulsification in water, specifically, an aliphatic urethane acrylic oligomer, BOMAR XR9416. The composition will develop in solvent or aqueous developer. Examples 5 and 6 contain a monomer capable of emulsification in water and a binder capable of hydrolysis in water (XR9416 and Polyvest MA75). The composition will develop easily in aqueous developer or even pure water.

Examples 7 and 8 demonstrate the composition can function as a printing plate.

Although the present invention has been described with reference to specific details, it is not intended that such details should be regarded as limitations upon the scope of the invention, except as and to the extent that they are included in the accompanying claims.

What is claimed is:

1. A method of preparing a printing member, the method comprising the steps of:
   providing a printing member comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of photopolymer polymerizable by actinic radiation, the photopolymer layer consisting essentially of an initiator, a water-dilutable but not water-soluble oligomer and a butadiene maleic anhydride copolymer;

exposing the precursor to actinic radiation through the photomask to cause polymerization of the photopolymer; and developing the printing member with an aqueous medium to remove only unexposed portions of the photopolymer layer.

2. The method of claim 1, wherein the photopolymer is capable of emulsification in water.

3. The method of claim 1, wherein the water-dilutable but not water-soluble oligomer is an aliphatic urethane acrylic oligomer.

4. The method of claim 1, wherein the photopolymer layer further comprises a dye.

5. The method of claim 1, wherein the photopolymer layer further comprises an anti-oxidant.

6. The method of claim 1, wherein the printing member is a flexographic printing member.

7. The method of claim 1, wherein the printing member is a letterpress printing member.

8. The method of claim 1, wherein the oligomer is an aliphatic urethane acrylic oligomer.

9. A printing member comprising:
a laser-ablatable layer comprising a material that absorbs laser radiation;
a support; and
disposed between the laser-ablatable layer and the support and in contact with opposed
surfaces thereof, a layer of photopolymer polymerizable by actinic radiation, the photopolymer layer comprising an initiator and a water-dilutable but not water-soluble oligomer and a butadiene maleic anhydride copolymer, wherein the photopolymer is developable by aqueous solvents.

10. The printing member of claim 9, wherein the laser-ablatable layer is ablatable by IR radiation.

11. The printing member of claim 10, wherein the laser-ablatable layer consists essentially of a polymer and carbon black dispersed therein.

12. The printing member of claim 9, wherein the butadiene maleic anhydride copolymer is a butadiene/styrene/maleic anhydride copolymer.

13. The printing member of claim 9, wherein the photopolymer layer further comprises a dye.

14. The printing member of claim 9, wherein the photopolymer layer further comprises an anti-oxidant.

15. The printing member of claim 9, wherein the oligomer is an aliphatic urethane acrylic oligomer.

* * * * *